(12) United States Patent
Yang

(10) Patent No.: US 6,282,108 B1
(45) Date of Patent: Aug. 28, 2001

(54) VOLTAGE CONTROL CIRCUIT

(75) Inventor: Tae Hum Yang, Seoul (KR)

(73) Assignee: Hyundai Electronics Industries Co., Ltd., Ichon-Shi (KR)

( * ) Notice: Subject to any disclaimer, the term of this patent is extended or adjusted under 35 U.S.C. 154(b) by 0 days.

(21) Appl. No.: 09/722,491

(22) Filed: Nov. 28, 2000

(30) Foreign Application Priority Data

Dec. 28, 1999 (KR) .................................................. 99-63952

(51) Int. Cl.[7] .................................................. H02M 3/18
(52) U.S. Cl. .................................................. 363/60
(58) Field of Search ..................... 363/59, 60; 327/535, 327/536, 537, 540; 307/110; 365/226

(56) References Cited

U.S. PATENT DOCUMENTS

| | | | |
|---|---|---|---|
| 4,961,007 | * 10/1990 | Kumanoya et al. | 327/589 |
| 5,164,889 | * 11/1992 | Ruetz | 363/60 |
| 5,642,072 | * 6/1997 | Miyamoto et al. | 327/535 |
| 5,940,283 | * 8/1999 | Mihara et al. | 363/60 |
| 6,052,022 | * 4/2000 | Lee | 327/589 |
| 6,075,403 | * 6/2000 | Ishikawa et al. | 327/536 |
| 6,128,242 | * 10/2000 | Banba et al. | 365/226 |
| 6,236,581 | * 5/2001 | Foss et al. | 363/60 |

* cited by examiner

Primary Examiner—Adolf Deneke Berhane
(74) Attorney, Agent, or Firm—Pennie & Edmonds LLP

(57) ABSTRACT

A voltage control circuit according to the present invention comprises a charge pump for generating a voltage depending on the clock signal inputted thereto; an oscillator for determining the cycle of the clock signal inputted to the charge pump; an adjusting unit for detecting the voltage generated from the charge pump to output an adjusting signal so that the oscillator can vary the cycle of the clock signal inputted to the charge pump.

7 Claims, 10 Drawing Sheets

VOLTAGE CONTROL CIRCUIT

FIELD OF THE INVENTION

The invention relates generally to a voltage control circuit, and more particularly to, a voltage control circuit by which the high voltage used in programming flash EEPROM is controlled, thus reducing the consumption power.

BACKGROUND OF THE INVENTION

Flash EEPROMs are programmed or erased by injecting electrons into the floating gate isolated between the control gate (or program gate) and the substrate or ejecting them therefrom.

Generally, in the NOR-type EEPROM cell, injecting electrons is called program, wherein channel hot electron method is usually used. That is, a voltage of about 9 volt is applied to the control gate, a voltage of about 5 volt is applied to the drain and the well and the source are grounded. In this condition, hot carriers are generated around the drain and electrons thereof are thus moved toward the gate by means of the electric field formed by the gate voltage. The program time at this time is about 5 $\mu s$~10 $\mu s$.

However, when a single outside power supply (Vcc is 5 volt, 3.3 volt, 2 volt, etc.) is used, in order to generate a high voltage necessary in programming, a charge pumping method is used. Then, after the voltage becomes higher, it is necessary to keep a constant voltage. The above-mentioned charge pumping method will be explained in detail.

The program voltage control circuit in the conventional flash EEPROM for realizing the charge pumping will be explained by reference to FIGS. 1 and 2.

As shown in FIG. 1, the conventional program voltage control circuit comprises a charge pump 20 for performing a pumping operation depending on a program signal PGM and an outside clock HVOSC that are inputted from the outside and an adjusting unit 30 for adjusting the output voltage from the charge pump 20. Also, the adjusting unit 30 comprises a voltage divider 31 for dividing the voltage outputted from the charge pump 20; a reference voltage generator 32 for generating a reference voltage; and a comparator 33 for comparing the dividing voltage REGLEVEL divided by the voltage divider with the reference voltage REGREF generated from the reference voltage generator 32 to control a leak path 34 depending on the output thereof, as shown in FIG. 2.

The charge pump 20 and the adjusting unit 30 are enabled by the program signal PGM. The charge pump 20 starts the pumping operation according to the outside clock HVOSC to produce a pumping voltage VPPI.

The pumping voltage VPPI outputted from the charge pump 20 is inputted to the adjusting unit 30. The pumping voltage VPPI is divided by the voltage divider 31 and is then inputted to the comparator 33. At this time, the comparator 33 compares the divided voltage REGLEVEL divided by the voltage divider 31 with the reference voltage REGREF produced by the reference voltage generator 32.

As a result of the comparison, when the divided voltage REGLEVEL becomes higher than the reference voltage REGREF, the comparator outputs a high signal. Due to this high signal, the transistor is turned on, so that remaining charges can be discharged via the leak path 34.

FIGS. 3A and 3B are the results of simulation showing variation of the voltage and the current, respectively. From the drawings, it could be seen that the current consumption by the output voltage of the charge pump 20 is similar around 9 volt.

In other words, as the charge pump is operated in a same cycle when the voltage is raised or kept constant, there is a problem that the consumption power is large because a constant amount of current is always consumed from the beginning the program to the end.

SUMMARY OF THE INVENTION

The present invention is contrived to solve the above-mentioned problem and has its object to provide a voltage control circuit in which a control signal is generated when a desired voltage is reached and the operating cycle is increased by the control signal, thus reducing the consumption of current.

In order to accomplish the above-mentioned object, the voltage control circuit according to the present invention is characterized in that it comprises a charge pump for generating a voltage depending on the clock signal inputted thereto; an oscillator for determining the cycle of the clock signal inputted to the charge pump; an adjusting unit for detecting the voltage generated from the charge pump to output an adjusting signal so that the oscillator can vary the cycle of the clock signal inputted to the charge pump.

BRIEF DESCRIPTION OF THE DRAWINGS

The aforementioned aspects and other features of the present invention will be explained in the following description, taken in conjunction with the accompanying drawings, wherein.

DETAILED DESCRIPTION OF PREFERRED EMBODIMENTS

Figure 1:
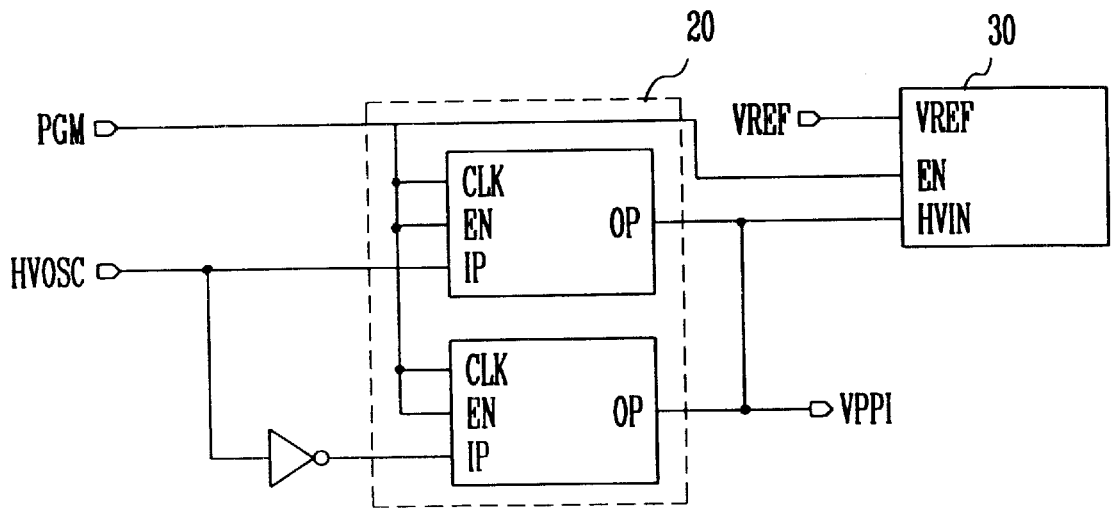
FIG. 1 shows a program voltage control circuit in the conventional EEPROM.
Figure 2:
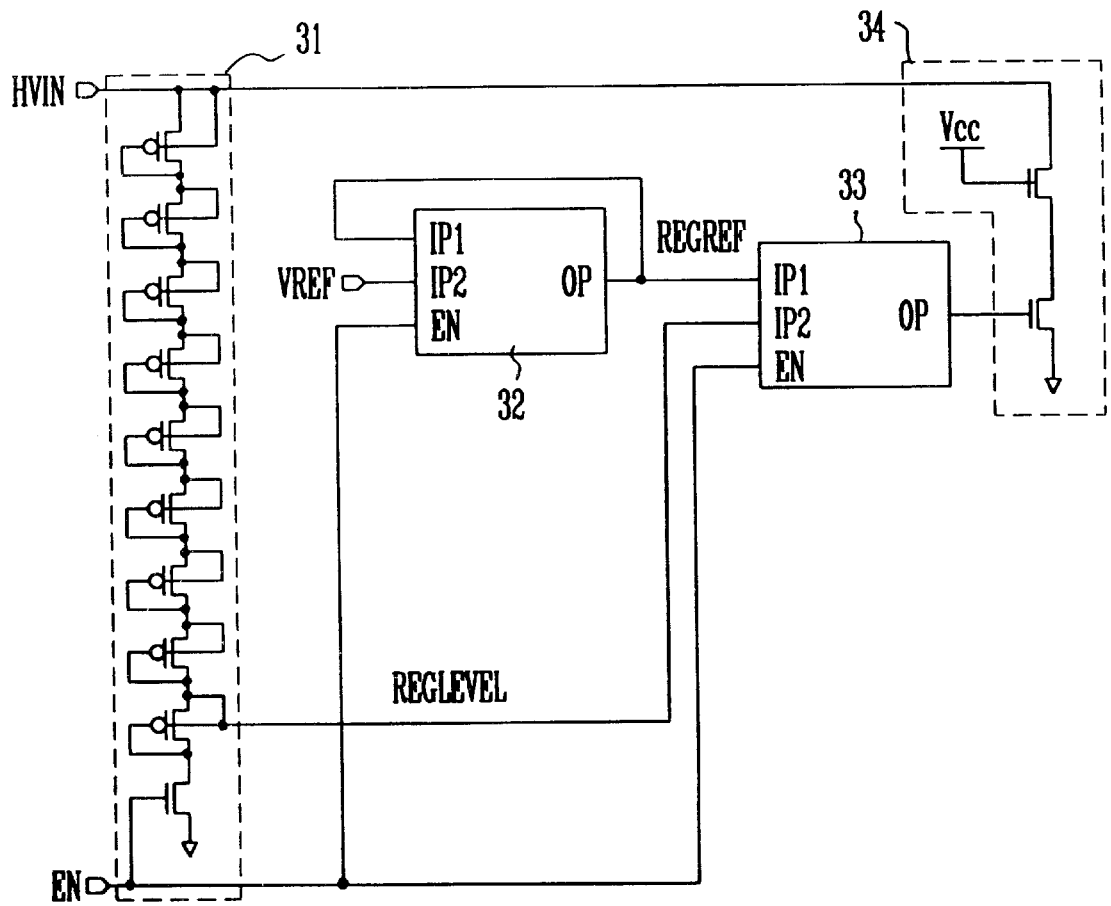
FIG. 2 is a detailed circuit diagram of an adjusting unit shown in FIG. 1.
Figure 3A:
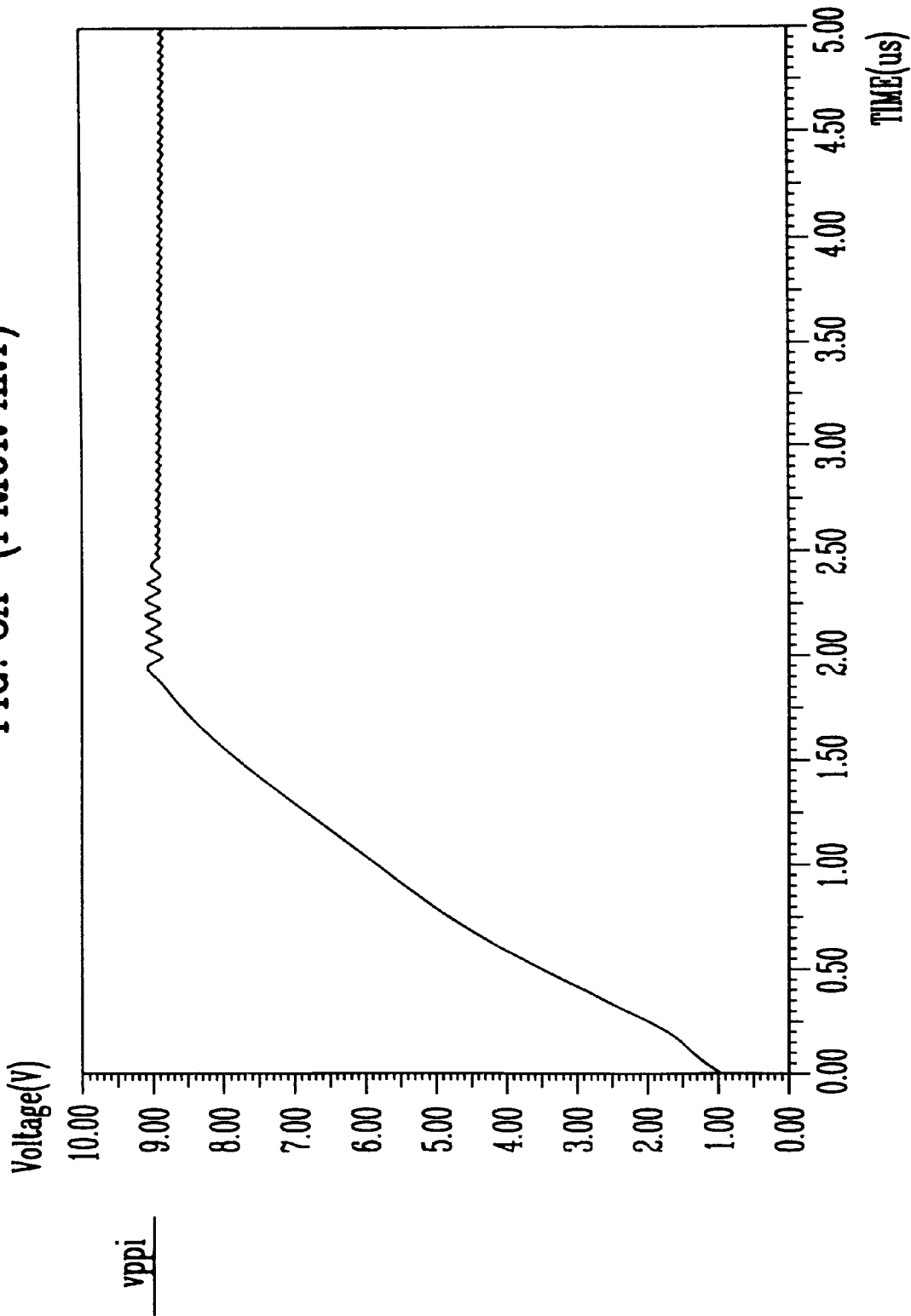
FIGS. 3A and 3B show output waveforms of the conventional flash EEPROM program voltage control circuit.
Figure 3B:
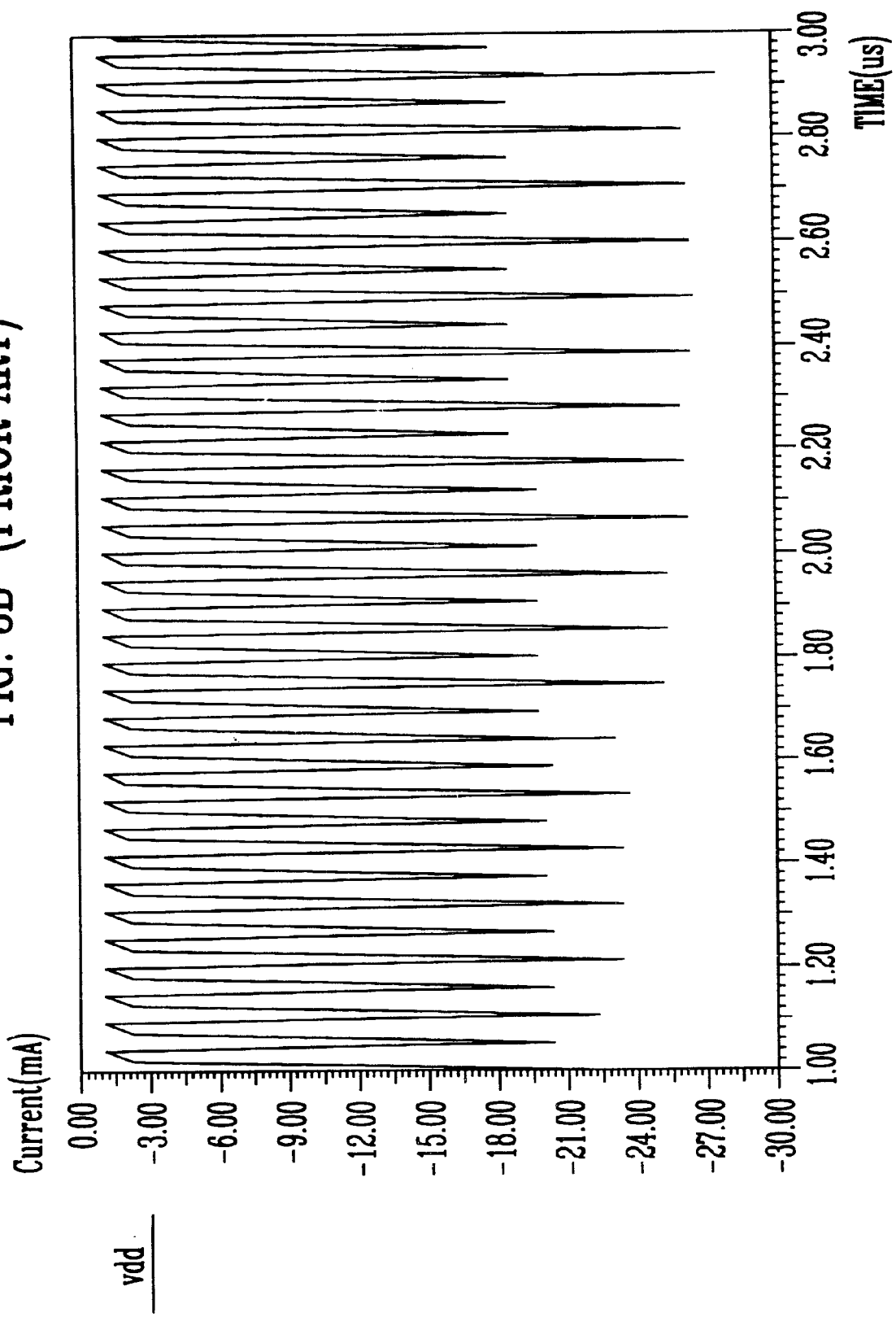

The present invention will be described in detail by way of a preferred embodiment with reference to accompanying drawings, in which like reference numerals are used to identify the same or similar parts.

Figure 4:
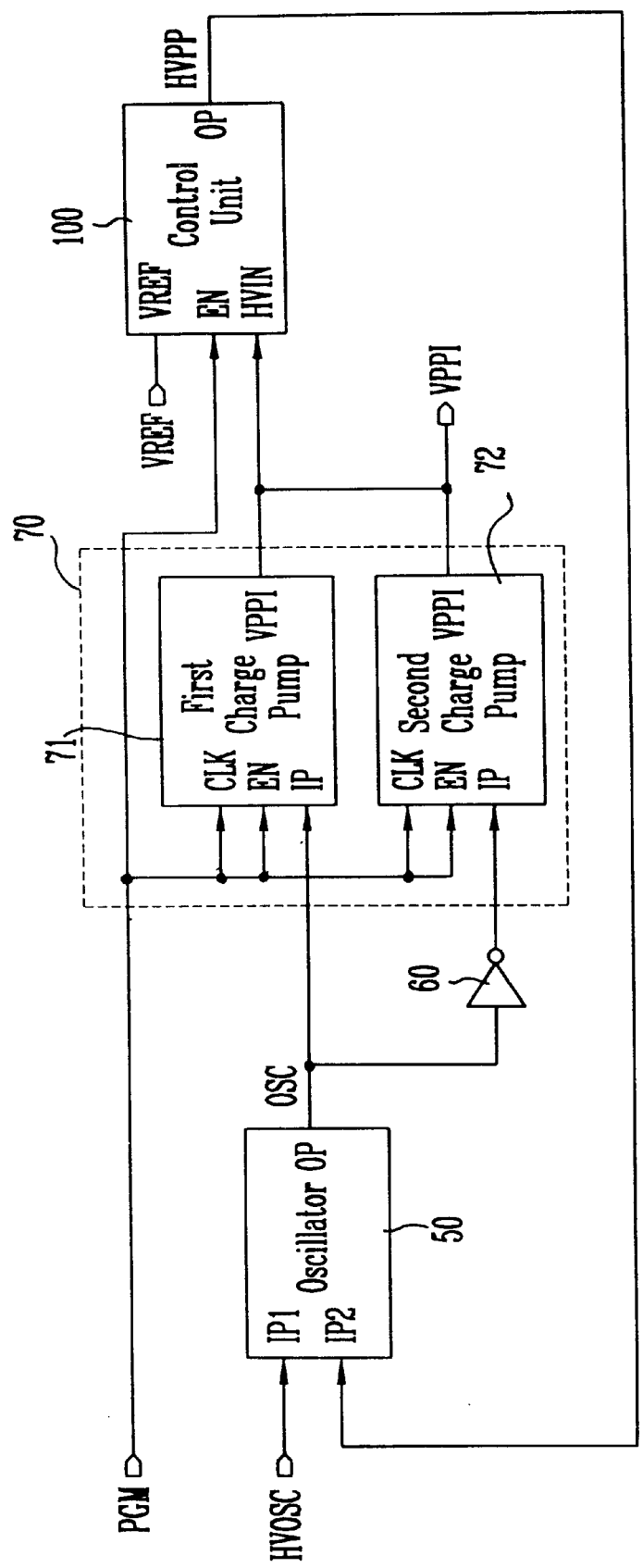
FIG. 4 shows a program voltage control circuit of a flash EEPROM according to the present invention.

Referring now to FIG. 4, the control section of the flash EEPROM includes a charge pump 70 that is enabled by the program signal PGM inputted from the outside and comprises first and second charge pumps 71 and 72; an adjusting unit 100 for comparing the high voltage generated from the charge pump 70 and the reference voltage to generate a signal for controlling the cycle of the signal outputted from an oscillator 50 which will be explained later; and an oscillator 50 for generating the signal to drive the charge pump 70 according to the signal inputted from the outside and the signal HVPP outputted from the adjusting unit 100.

Figure 5A:
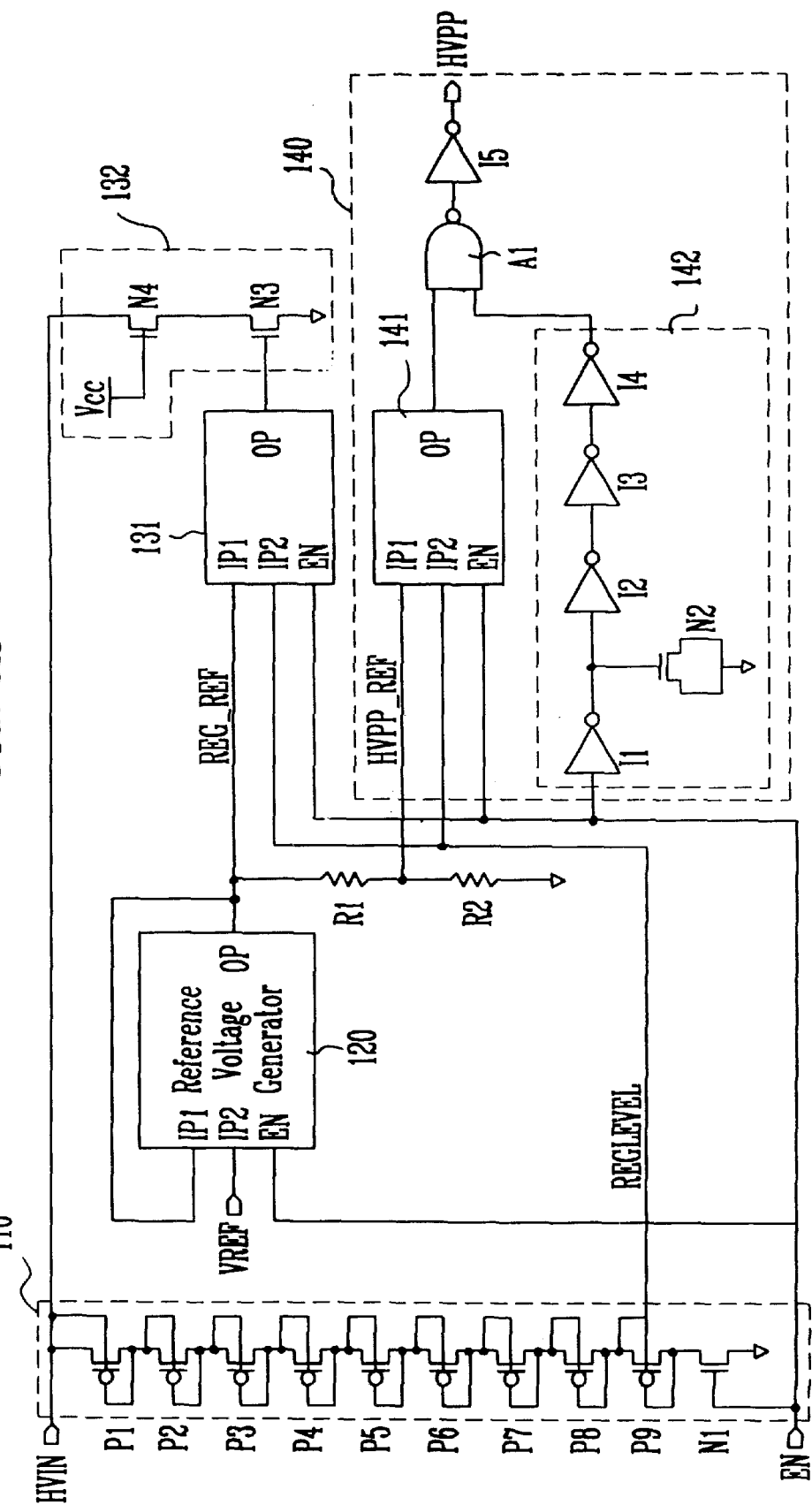
FIG. 5A shows a first embodiment of an adjusting unit shown in FIG. 4.

The adjusting unit 100 may be implemented in two ways. As shown in FIG. 5A, a first embodiment of the adjusting unit will be first explained below The adjusting unit 100 mainly comprises a reference voltage generator 120 for receiving the voltage from the outside to generate a reference voltage, a voltage divider 110 or divide the high voltages generated by the charge pump 70, an adjusting signal controller 140 for comparing the reference voltage generated from the reference voltage generator 120 with the divided voltage from voltage divider 110 to generate an adjusting signal adjusting the clock cycle of the oscillator.

First, in order to divide the voltage VPPI inputted thereto, the voltage divider 110 comprises a plurality of PMOS transistors P1 to P9 and a NMOS transistor N1, which are serially connected between the output terminal and the ground of the voltage divider 110. If the NMOS transistor N1 is turned on according to the program signal PGM inputted via the port EN, the voltage VPPI is divided depending on the number of the elements connected thereto. Then, the divided voltage REGLEVEL is inputted to a leak path controller 131 and an adjusting signal controller 140.

The reference voltage generator 120 receives the program signal PGM and the outside reference voltage VREF to output a reference voltage REG-REF to the output terminal. The output terminal of the reference voltage generator 120 is connected to the ground via the resistors R1 and R2 in order to divide the voltage REG-REF outputted from the reference voltage generator 120 while being directly connected to the leak path controller 131. Further, the voltage HVPP_REF divided by the resistors R1 and R2 is inputted to the adjusting signal controller 140.

The adjusting signal controller 140 includes an adjusting signal generator 141 and a delay section 142 in which a plurality of inverter elements I1 through I4 are serially connected. The output terminal of the final inverter I4 in the delay section 142 and the output terminal of the adjusting signal generator 141 are connected to the input terminal of the NAND gate A1. Also, to the output terminal of the NAND gate A1 is connected the verter I5 and to the output terminal of the inverter I5 is connected the oscillator 50 in FIG. 4.

Also, the adjusting unit 100 includes a leak path controller 131 wherein to the port EN of which is inputted the program signal PGM, to the port IP2 thereof is inputted the voltage REGLEVEL divided by the voltage divider 110 and to the port IP1 thereof is connected the output terminal of the reference voltage generator 120. Further, to the output terminal of the leak path controller 131 is connected a leak path 132 comprising a NMOS transistor N3 and a high voltage transistor N4. Between the drain of the NMOS transistor N3 and the terminal HVIN is connected the high voltage transistor N4.

Figure 5B:
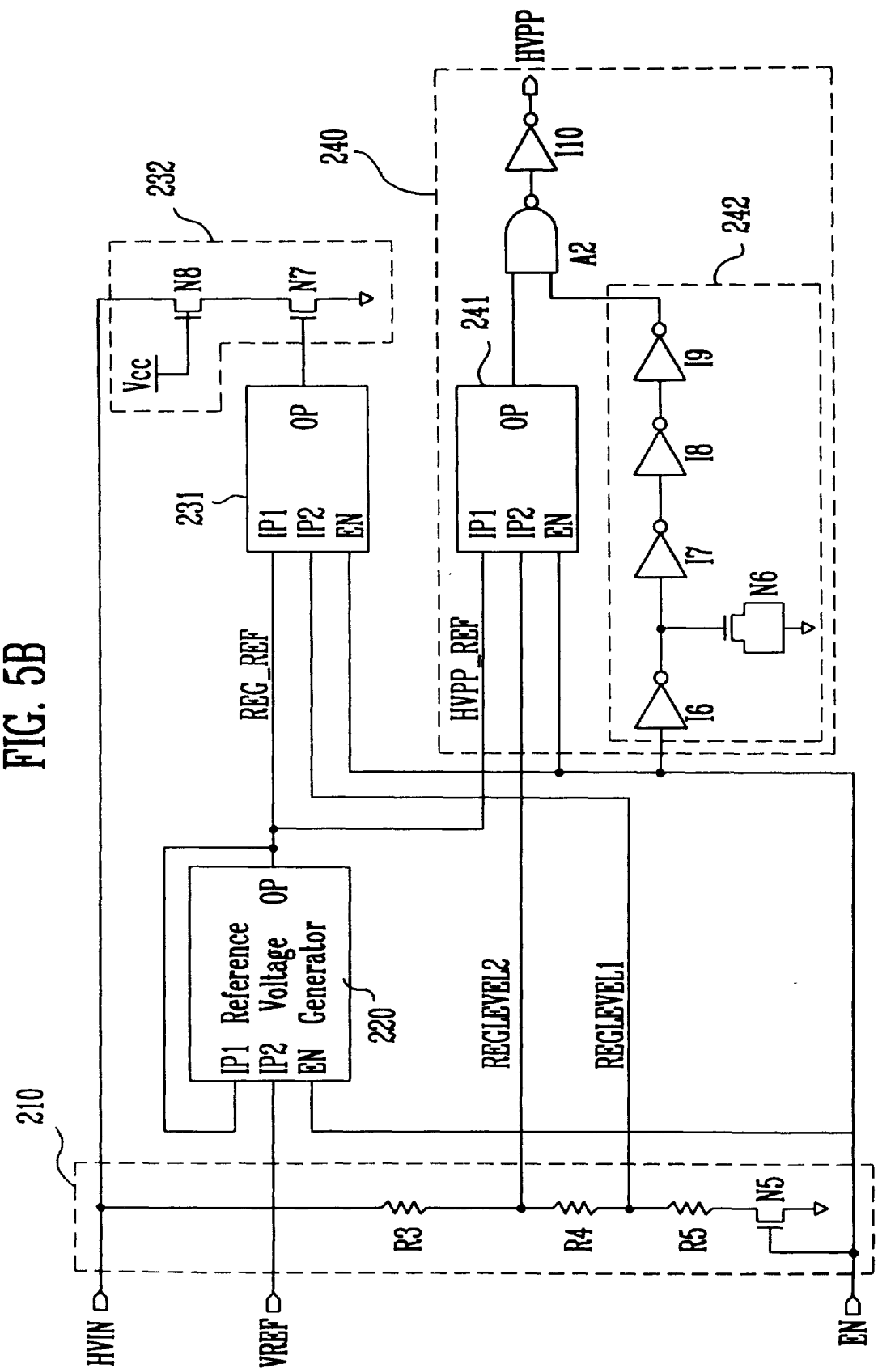
FIG. 5B shows a second embodiment of an adjusting unit shown in FIG. 4.

FIG. 5B shows a second embodiment of the adjusting unit including a modified voltage divider 210. The voltage divider of the second embodiment comprises a plurality of resistors R3 through R5 and a MOS transistor N5, which are serially connected and outputs a first dividing voltage REGLEVEL1 and a second dividing voltage REGLEVEL2. Also, the output terminals of the dividing voltage are connected to the adjusting signal generator 241 and the leak path controller 231, respectively.

Figure 6:
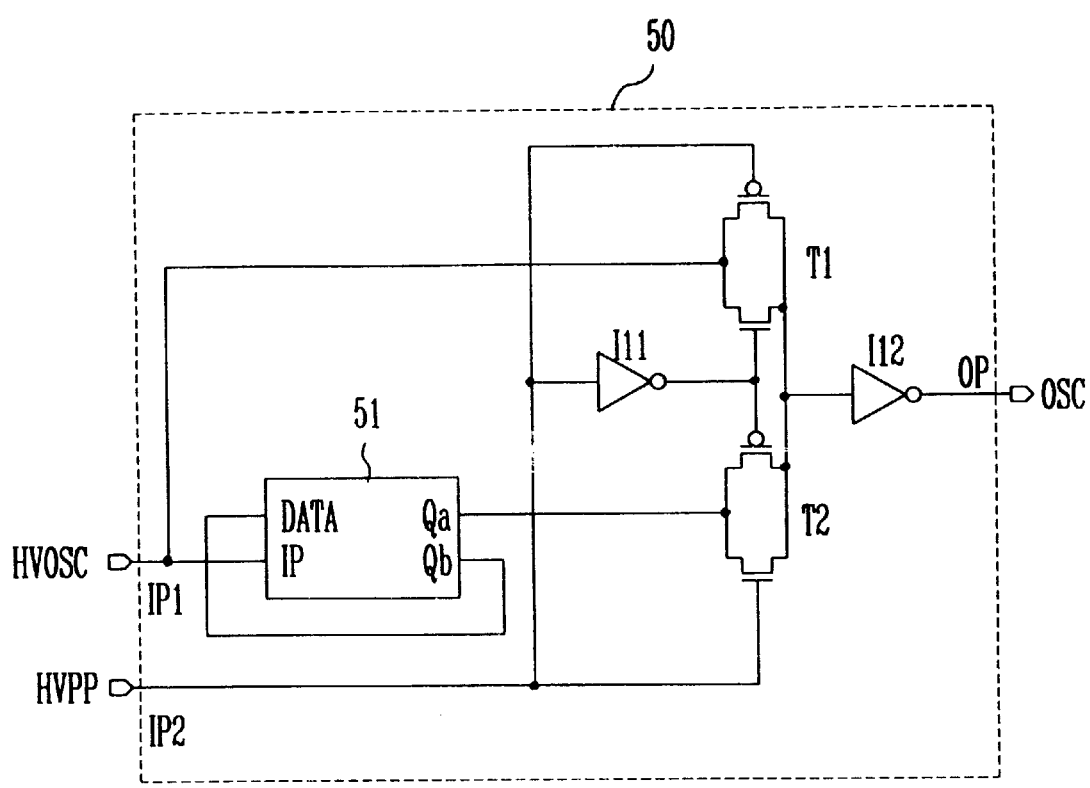
FIG. 6 is a circuit diagram of an oscillating section in the flash EEPROM program voltage control circuit according to the present invention.

On the other hand, referring now to FIG. 6, the oscillator 50 receives the external clock and the control signal from the adjusting unit to output a clock OSC for determining the operating cycle of the charge pump 70. It outputs the external clock HVOSC or the internally generated signal as the clock OSC depending on the output signal HVPP (high or low signal) of the adjusting signal controller. In order to do so, the oscillator 50 includes a cycle converter 51 receiving the external clock HVOSC and then extending the cycle of the external clock HVOSC twice times, and a switching section for selectively outputting the external clock HVOSC or the output signal from the cycle converter 51 depending on the adjusting signal HVPP. The switching section includes transmission gates T1 and T2 and inverters I11 and I12.

The operation according to the above-mentioned construction will be below explained in detail.

Upon program of the flash EEPROM, the program signal PGM and the external clock HVOSC are received from the outside. If the program signal PGM is received, it is inputted to the charge pump 70 and the adjusting unit 100. Then, to the oscillator 50 is inputted the above-mentioned external clock HVOSC and the adjusting signal HVPP outputted from the adjusting unit 100. The oscillator 50 outputs the clock OSC to determine the operating cycle of the charge pump 70 depending on the external clock and the adjusting signal. At first, the adjusting signal HVPP outputted from the adjusting unit 100 becomes a low signal, which is not only applied to the gate of the transistor P11 but also applied to the gate of the transistors P10 and N10 after being transformed into a high signal by the inverter I11.

Thus, the transistor N10 and the transistor P11 are turned on and the external clock HVOSC outputted as the clock OSC via the inverter I12.

The clock OSC outputted from the oscillator 50 is inputted to the charge pump 70, wherein the operation of the charge pump 70 is determined by the program signal PGM and the clock OSC, and outputs the high voltage VPPI to the port HVIN of the adjusting unit 100.

The operation of the present invention according to the first embodiment of the adjusting unit 100 is as follows:

The voltage divider 110 divides the voltage VPPI inputted to the port HVIN using the MOS diode chains P1 to P9 connected thereto, wherein the voltage VPPI is divided based on the number of the voltage VPPI/diode depending on the number of the diode, thus producing a divided voltage REGLEVEL Then, the program signal PGM inputted to the port EN of the adjusting unit 100 is inputted to the port EN of the reference voltage generator 120, which is thus enabled.

The reference voltage generator 120 outputs a first comparator voltage REG_REF, which is then inputted to the leak path controller 131 and is also inputted to the adjusting signal generator 141 after it is divided into a second comparator voltage HVPP_REF by means of the resistor R1 and the resistor R2. At this time, the second comparator voltage HVPP_REF sets the resistance ratio of the resistors R1 and R2 so that the voltage of the second comparator voltage HVPP_REF becomes about 90~95% of that of the first reference voltage REG_REF.

The leak path controller 131 receives the first comparator voltage REG_REF from the reference voltage generator 120 and also receives the divided voltage REGLEVEL from the voltage divider 110. Also, the leak path controller 131 is enabled by the program signal PGM inputted to the port EN.

While being enabled, the leak path controller 131 compares the first comparator voltage REG_REF and the divided voltage REGLEVEL. As a result of the comparison, if the divided voltage REGLEVEL is higher than the first comparator voltage, the leak path controller 131 outputs a high signal. Otherwise, if the divided voltage REGLEVEL is below than the first comparator voltage, it outputs a low signal.

If a high signal is outputted from the leak path controller 131, the leak path 132 is operated. In concrete, as the transistors N3 and N4 are turned on to flow the current, the charges are discharged. If the charges are discharged, the voltage generated from the charge pump becomes lower.

If the voltage becomes lower, as the divided voltage REGLEVEL outputted from the voltage divider 110 becomes lower, it falls below the first reference voltage REG_REF inputted to the leak path controller 131. Thus, the leak path controller 131 outputs a low signal, so that the transistors N3 and N4 of the leak path 132 are turned off. If the transistors N3 and N4 are turned off, the leak path 132 through which the charge flow is blocked and the divided voltage REGLEVEL of the voltage divider 110 is again raised.

Meanwhile, the operation of the adjusting signal controller 140 is as follows:

The adjusting signal generator 141 receives the second comparator voltage HVPP_REF and the divided voltage REGLEVEL and also receives the program signal PGM. Thus, the adjusting signal generator 141 is enabled by the program signal PGM. If the adjusting signal generator 141 is enabled, it compares the divided voltage REGLEVEL and the second comparator voltage HVPP_REF. As a result of the comparison, if the divided voltage reaches the second divided voltage, the adjusting signal generator 141 outputs a high signal to the input terminal on one side of the NAND gate A1.

At this time, the program signal PGM is inputted to the delay section 142 as a high signal, wherein the delay section 142 delays the inputted signal for a given time period, that is the time when the elements are delayed, and then outputs it to the input terminal on other side of the NAND gate A1.

Then, high signals are inputted to both the input terminals of the NAND gate A1. Therefore, the NAND gate A1 outputs a low signal and the inverter I5 transforms the low signal into a high signal to output it to the oscillator 50. Thus, the adjusting signal HVPP is transformed from the low signal to the high signal.

Meanwhile, as the adjusting signal HVPP being the high signal is inputted to the oscillator 50, a high signal is applied to the gate of the transistor P11 and a low signal is applied to the gate of the transistor N10 via the inverter I11. Therefore, the transistors P11 and N10 are turned off. Also, a high signal is applied to the gate of the transistor N11 and a low signal is applied to the gate of the transistor P10 via the inverter I11. Therefore, the transistors N11 and P10 are turned on, so that the signal outputted from the port Qa of the cycle converter 51 is outputted as the clock OSC via the inverter I12. At this time, the cycle of the outputted signal is twice times compared to that when the external clock HVOSC is outputted.

If the cycle of the clock OSC is changed, the operating cycle of the charge pump 70 is changed. Thus, the cycle of the clock OSC is lengthened, the operating cycle of the charge pump 70 is also lengthened, thus reducing the output voltage of the charge pump 70. The consumption of current is also reduced.

If the output voltage of the charge pump 70 is reduced, the divided voltage REGLEVEL of the voltage divider 110 is reduced. Therefore, the divided voltage REGLEVEL is more lowered than the second reference voltage HVPP_REF inputted to the adjusting signal generator 141. Thus, the adjusting signal HVPP is finally outputted as a low signal.

If the adjusting signal HVPP is inputted to the oscillator 50 as a low signal, a low signal is applied to the gate of the transistor P11 and a high signal is applied to the gate of the transistor N10 via the inverter I11. Therefore, the transistors P11 and N10 are turned on. Also, a low signal is applied to the gate of the transistor N11 and a high signal is applied to the gate of the transistor P10 via the inverter I11. Therefore, the transistors N11 and P10 are turned off, so that the external clock HVOSC is outputted as the clock OSC to shorten its cycle. If the cycle of the clock OSC shortens, the operating cycle of the charge pump 70 also shortens, thus raising the output voltage of the charge pump 70.

As mentioned above, not only the output voltage of the charge pump 70 is always kept constant depending on the operation of the leak path controller 131 and the adjusting signal controller 140 but also the current consumption can be reduced. As the second reference voltage HVPP_REF inputted to the adjusting signal generator 141 is lower than the first reference voltage REG_REF inputted to the leak path controller 131, when if the output voltage of the charge pump 70 is raised, the adjusting signal is outputted from the adjusting signal controller before the leak path controller 131 is operated, so that the output voltage of the charge pump can be kept constant by preventing the flow of the current. At this time, the difference in the operating time between the leak path controller 131 and the adjusting signal controller 140 can be adjusted by adjusting the delay time of the above-mentioned delay section 142.

The present invention according to the second embodiment of the adjusting unit will be below explained.

The second embodiment of the adjusting unit comprises a voltage divider 210 in which a plurality of resistors R3, R4 and R5 and a transistor N5 are included. The voltage divider 210 outputs a first divided voltage REGLEVEL1 that is applied to the leak path controller 231 and a second divided voltage REGLEVEL2 that is applied to the adjusting signal generator 241 depending on the resistance ratio of the resistors R3, R4 and R5. Here, the voltage ratios of the resistors R3, R4 and R5 are set so that the second divided voltage is larger about 5~10% than the first divided voltage such that the voltage divider 231 can be operated in the same manner as the first embodiment of the adjusting unit. Also, the reference voltage REG_REF outputted from the reference voltage generator 220 is inputted to both the leak path controller 231 and the adjusting signal generator 241. Further, the remaining operations are same to those of the first embodiment of the above-mentioned adjusting unit. Thus, the detailed description thereof will be omitted for simplicity.

Meanwhile, the output voltage of the charge pump and the adjusting signal outputted from the adjusting unit according to the above-mentioned operation, and the state of current consumption will be explained below by reference to FIG. 7.

Figure 7A:
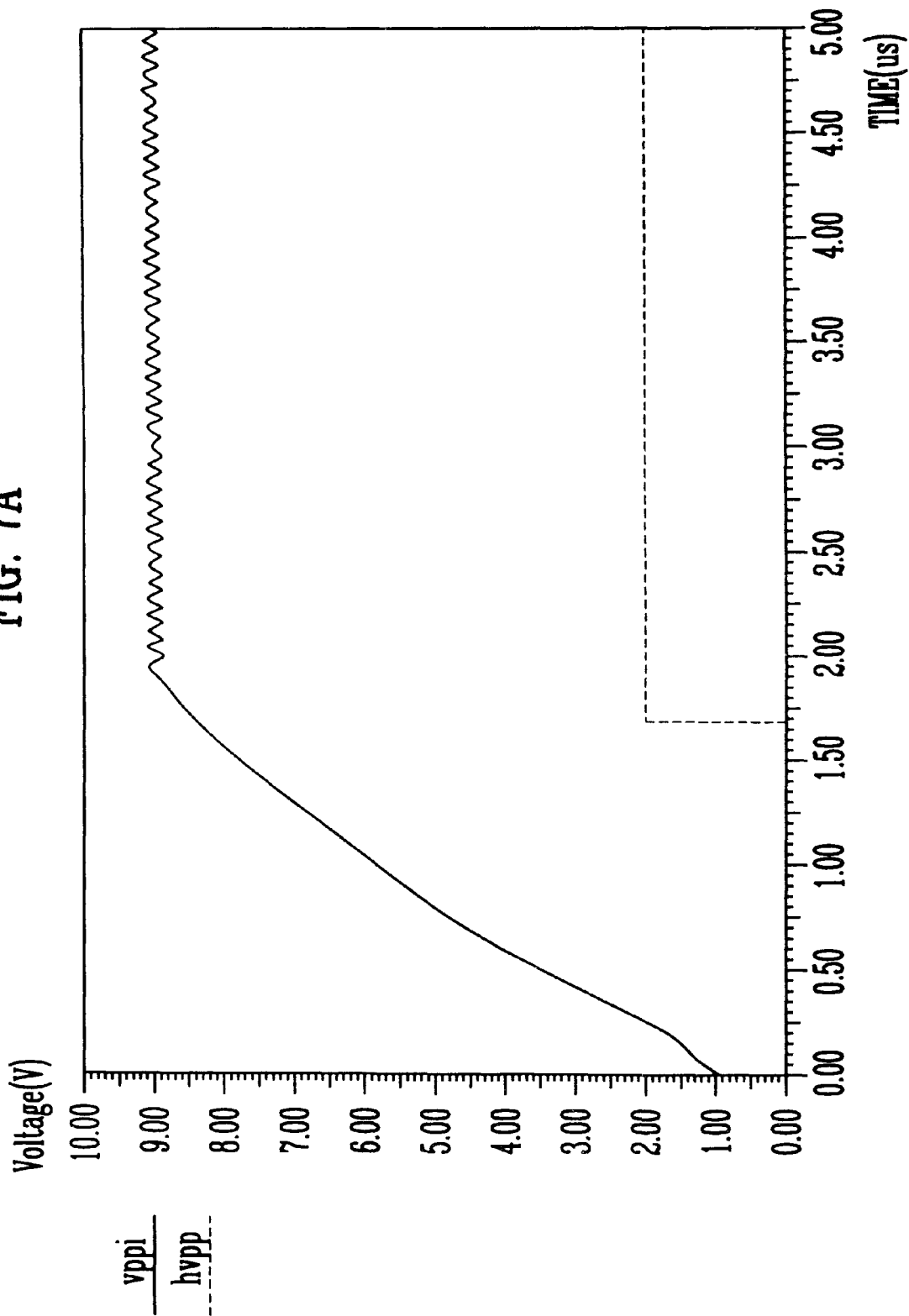
FIGS. 7A, 7B and 7C show the output waveforms of the flash EEPROM program voltage control circuit according to the present invention.
Figure 7B:
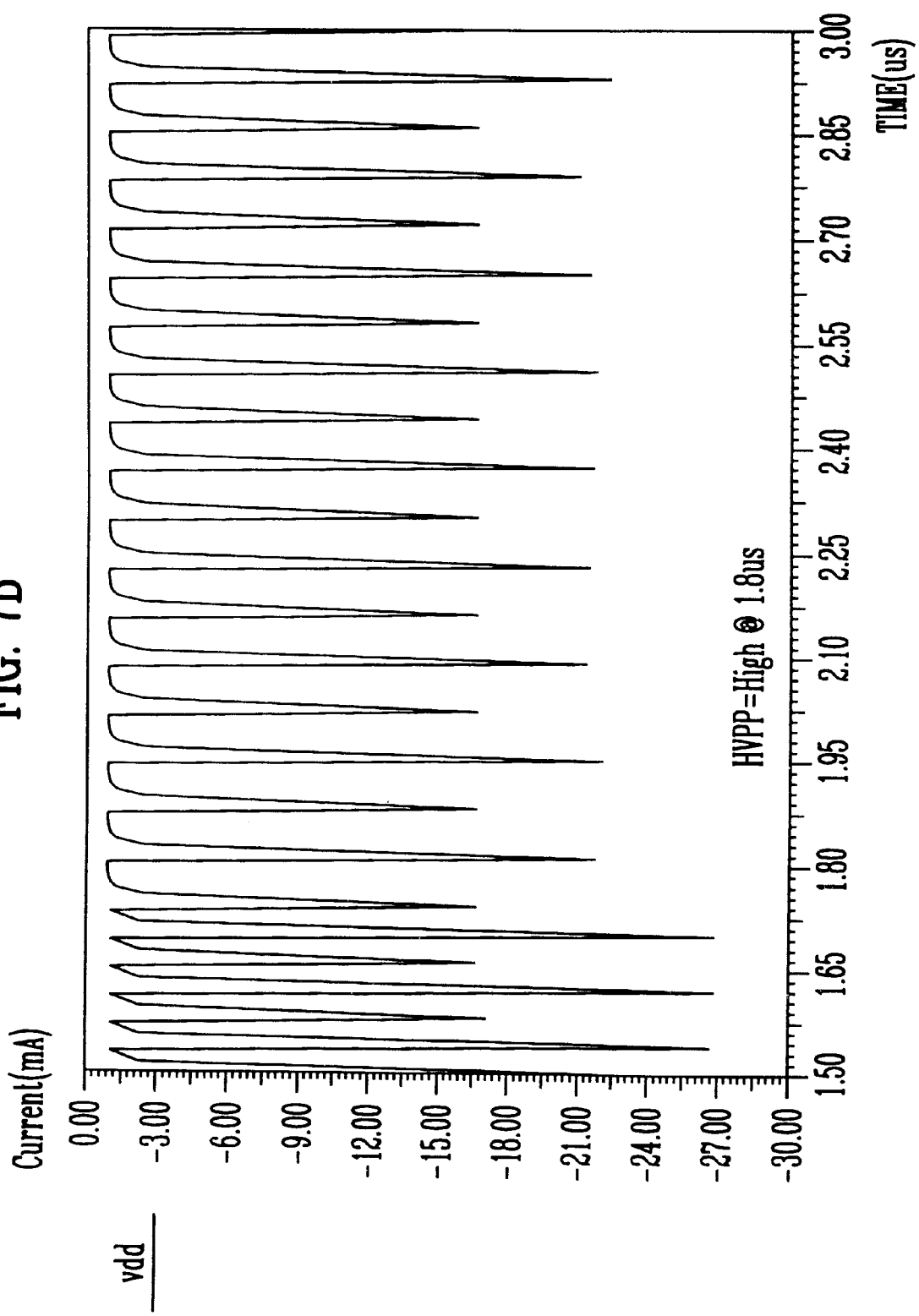

Referring now to FIGS. 7A and 7B, the adjusting signal HVPP is kept low and an inverted signal of the external clock HVOSC is outputted as the clock OSC, until the output signal VPPI of the charge pump 70 becomes 9 volt. Then, if the output voltage VPPI becomes 9 volt, the adjusting signal HVPP becomes high, so that the signal the cycle of which is lengthened is outputted as the clock OSC.

Figure 7C:
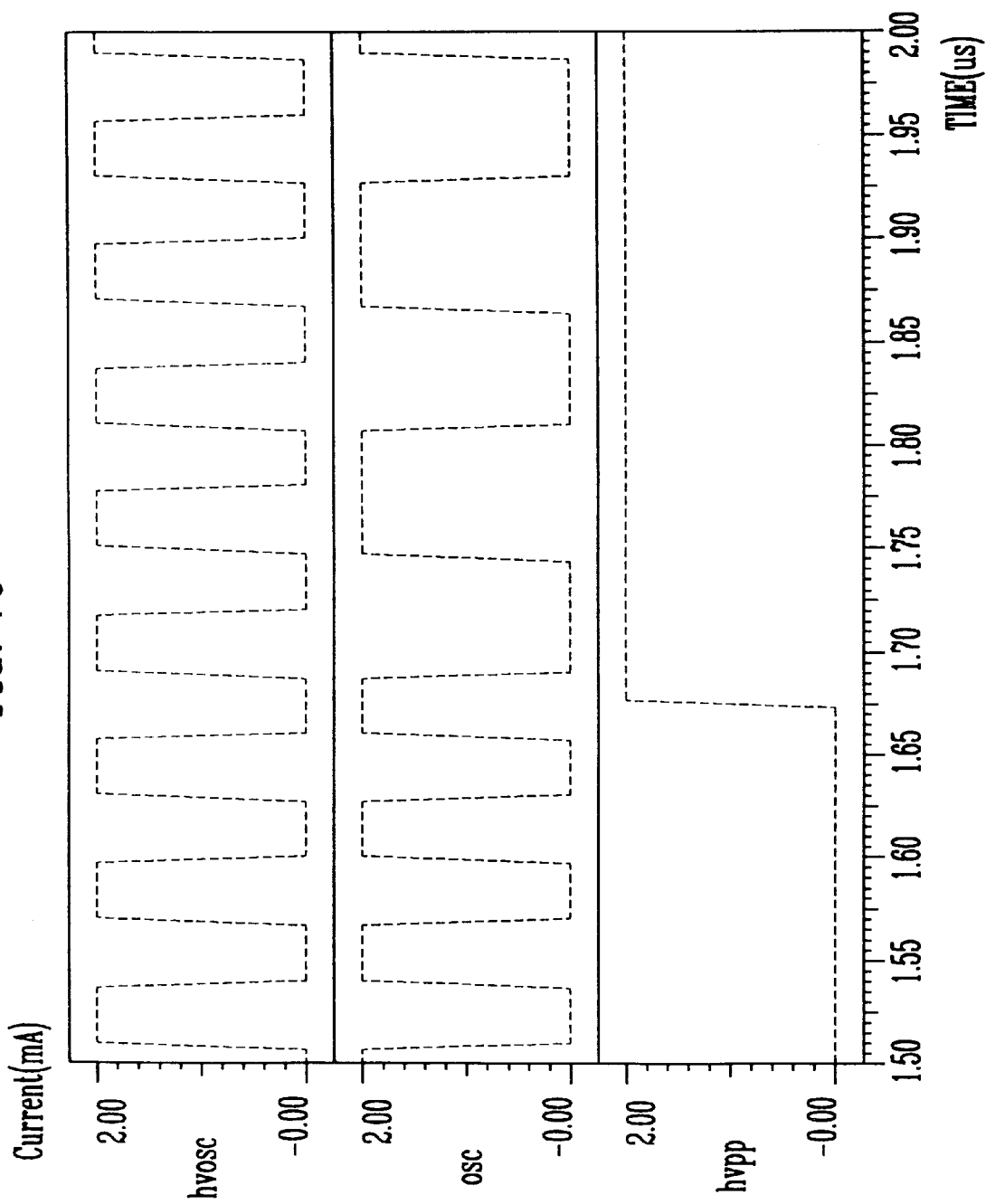

Referring to FIG. 7C, it could be seen that the amount of current consumption is different when the output voltage VPPI becomes 9 volt and the cycle of the clock OSC is lengthened, that is before and after about 1.8 μs. In other words, it could be seen that the amount of current consumption is reduced after the output voltage VPPI of the charge pump 70 becomes 9 volt.

As can be understood from the above description, the voltage control circuit of the present invention includes a charge pump for generating the voltage upon program of flash EEMROM; an oscillator having a cycle converter for receiving the external clock to transform the cycle of the clock so that the cycle of the operating signal of the charge pump can be varied and a switching section for selectively outputting the external clock and the output signal from the cycle converter using the adjusting signal; a voltage divider for dividing the voltage outputted from the charge pump; a reference voltage generator for generating a reference voltage to compare the output voltage of the voltage divider; a leak path controller for comparing the voltage divided by the voltage divider with a first reference voltage to control the operation of the leak path depending on the result of said comparison; and an adjusting signal controller for comparing a second reference voltage set lower than the first reference voltage to output an adjusting signal depending on the result of said comparison. Due to this construction, the consumption current can be reduced by lengthening the cycle of the signal to determine the operating cycle of the charge pump, when the output voltage of the charge pump becomes constant upon programming of the flash EEPROM.

The present invention has been described with reference to a particular embodiment in connection with a particular application. Those having ordinary skill in the art and access to the teachings of the present invention will recognize additional modifications and applications within the scope thereof.

It is therefore intended by the appended claims to cover any and all such applications, modifications, and embodiments within the scope of the present invention.

What is claimed is:

1. A voltage control circuit comprising:
   a charge pump for generating a voltage depending on a clock signal input thereto;
   an oscillator for determining a cycle of the clock signal input to said charge pump; and
   an adjusting unit for detecting the voltage generated from said charge pump to output an adjusting signal which is fed back to the oscillator so that said oscillator can vary the cycle of the clock signal inputted to said charge pump.

2. The voltage control circuit according to claim 1, wherein said oscillator comprises:
   a cycle converter for receiving an external clock and transforming a cycle of said external clock; and
   a switching section for selectively outputting said external clock or an output signal of said cycle converter, based on said adjusting signal.

3. The voltage control circuit according to claim 1, wherein said adjusting unit comprises:
   a first voltage divider for dividing the voltage outputted from said charge pump to thereby provide a first divided voltage;
   a reference voltage generator for generating a first reference voltage to be compared with said first divided voltage;
   a leak path controller configured to perform a first comparison comparing the first divided voltage with said first reference voltage, and control operation of the leak path depending on the result of said first comparison; and
   an adjusting signal configured to perform a second comparison comparing the first divided voltage with a second reference voltage set lower than said first reference voltage, and to output said adjusting signal depending on the result of said second comparison.

4. The voltage control circuit according to claim 3, comprising a second voltage divider having input thereto said first reference voltage, and wherein said second reference voltage is obtained from said second voltage divider.

5. The voltage control circuit according to claim 3, wherein the oscillator varies the cycle of the clock signal inputted to said charge pump, only if the first divided voltage reaches the second reference voltage.

6. The voltage control circuit according to claim 1, wherein said adjusting unit comprises:
   a first voltage divider for dividing the voltage outputted from said charge pump to thereby provide a first divided voltage and a second divided voltage, the second divided voltage being higher than said first divided voltage;
   a reference voltage generator for generating a first reference voltage to be compared with said first divided voltage and said second divided voltage;
   a leak path controller configured to perform a first comparison comparing the first divided voltage with the first reference voltage, and control operation of the leak path depending on the result of said first comparison; and
   an adjusting signal configured to perform a second comparison comparing the second divided voltage with a first reference voltage and to output said adjusting signal depending on the result of said second comparison.

7. The voltage control circuit according to claim 6, wherein the oscillator varies the cycle of the clock signal inputted to said charge pump, only if the second divided voltage reaches the first reference voltage.

* * * * *